US010341777B2

(12) United States Patent
Dong et al.

(10) Patent No.: US 10,341,777 B2
(45) Date of Patent: Jul. 2, 2019

(54) SPEAKER MODULE

(71) Applicant: GOERTEK INC., Weifaing, Shandong (CN)

(72) Inventors: Qingbin Dong, Weifang (CN); Jie He, Weifang (CN); Wuchao Wang, Weifang (CN)

(73) Assignee: GOERTEK INC., Weifang, Shandong (CN)

( * ) Notice: Subject to any disclaimer, the term of this patent is extended or adjusted under 35 U.S.C. 154(b) by 14 days.

(21) Appl. No.: 15/573,727

(22) PCT Filed: Dec. 8, 2015

(86) PCT No.: PCT/CN2015/096713
§ 371 (c)(1),
(2) Date: Nov. 13, 2017

(87) PCT Pub. No.: WO2016/197569
PCT Pub. Date: Dec. 15, 2016

(65) Prior Publication Data
US 2018/0152790 A1 May 31, 2018

(30) Foreign Application Priority Data

Jun. 8, 2015 (CN) .......................... 2015 1 0309218

(51) Int. Cl.
*H04R 9/02* (2006.01)
*H04R 9/06* (2006.01)
(Continued)

(52) U.S. Cl.
CPC .............. *H04R 9/022* (2013.01); *H04R 1/021* (2013.01); *H04R 1/028* (2013.01); *H04R 9/06* (2013.01); *H04R 2499/11* (2013.01); *H05K 7/20* (2013.01)

(58) Field of Classification Search
CPC .......... H04R 9/022; H04R 9/06; H04R 1/028; H04R 2499/11; H04R 29/001; H05K 7/20
See application file for complete search history.

(56) References Cited

U.S. PATENT DOCUMENTS 3,991,286 A * 11/1976 Henricksen .............. H04R 9/00
381/189
5,886,870 A * 3/1999 Omori ..................... H01L 23/32
165/185

(Continued)

FOREIGN PATENT DOCUMENTS

CN 2539370 3/2003
CN 2539370 Y * 3/2003

(Continued)

OTHER PUBLICATIONS

International Search Report dated Mar. 2, 2016; PCT/CN2015/096713.

(Continued)

*Primary Examiner* — Davetta W Goins
*Assistant Examiner* — Kuassi A Ganmavo
(74) *Attorney, Agent, or Firm* — Ladas & Parry LLP

(57) ABSTRACT

It is disclosed a speaker module, including a module housing, a speaker assembly and a heat-dissipating member. The module housing has an inner cavity, the inner cavity includes a front cavity and a rear cavity spaced apart from the front cavity, and the front cavity is communicated with an external space. The speaker assembly is mounted in the inner cavity, the speaker assembly includes a vibration diaphragm spacing the front cavity and the rear cavity apart. The heat-dissipating member has a heat-conducting section and a heat-dissipating section, the heat-conducting section is in contact with the speaker assembly, the heat-dissipating section stretches into the front cavity. The vibration of the vibration diaphragm allows air in the front cavity to flow to (Continued)

increase the heat-dissipating rate of the heat-dissipating section. The heat-dissipating section may have a heat-dissipating structure for increasing a heat-dissipating area, and the heat-dissipating structure may be a heat-dissipating fin. The speaker module provided by the present invention has a favorable heat dissipation performance, and is capable of duly transferring heat generated by the speaker during operation to the outside of the module.

6 Claims, 4 Drawing Sheets

(51) Int. Cl.
  *H04R 1/02* (2006.01)
  *H05K 7/20* (2006.01)

(56) References Cited

U.S. PATENT DOCUMENTS

| | | | | |
|---|---|---|---|---|
| 2011/0182463 A1* | 7/2011 | Lee | ............... | H04R 9/025 |
| | | | | 381/412 |
| 2013/0315429 A1* | 11/2013 | Parker | ............... | H04R 1/2857 |
| | | | | 381/345 |
| 2015/0023544 A1* | 1/2015 | Chu | ............... | H04R 9/022 |
| | | | | 381/397 |
| 2015/0358705 A1* | 12/2015 | Chen | ............... | H04R 1/2842 |
| | | | | 381/386 |
| 2016/0295316 A1* | 10/2016 | Shao | ............... | H04R 1/025 |
| 2016/0323673 A1* | 11/2016 | Peng | ............... | H04R 9/022 |

FOREIGN PATENT DOCUMENTS

| | | | | | |
|---|---|---|---|---|---|
| CN | 101697602 | A | * | 4/2010 | |
| CN | 201518532 | U | | 6/2010 | |
| CN | 103209373 | A | * | 7/2013 | |
| CN | 203225876 | U | * | 10/2013 | |
| CN | 103686550 | A | * | 3/2014 | ............ H04R 1/025 |
| CN | 104519449 | A | | 4/2015 | |
| CN | 104902358 | A | | 9/2015 | |
| CN | 103747398 | B | | 5/2017 | |
| JP | 4893513 | B2 | * | 3/2012 | ............ H04R 9/02 |
| KR | 20040050960 | A | * | 6/2004 | |

OTHER PUBLICATIONS

Opinion of the International Searching Authority; dated Mar. 2, 2016; PCT/CN2015/096713.
International Preliminary Report on Patentability dated Dec. 12, 2017; PCT/CN2015/096713.
The First Chinese Office action; Appln. No. 201510309218.X.
The Second Chinese Office Action Appln. No. 201510309218.X.

* cited by examiner

SPEAKER MODULE

CROSS REFERENCE TO RELATED APPLICATIONS

This application is a National Stage of International Application No. PCT/CN2015/096713, filed on Dec. 8, 2015, which claims priority to Chinese Patent Application No. 201510309218.X, filed on Jun. 8, 2015, both of which are hereby incorporated by reference in their entireties.

FIELD OF THE INVENTION

The present invention relates to the field of the technical field of acoustic-electric energy conversion and particularly to the technical field of micro speakers, and in particular, to a structural design and features of a speaker module.

BACKGROUND OF THE INVENTION

A micro speaker is an essential part in a modern mobile electronic device. With the gradual development of the mobile electronic device, higher requirement is presented on performances, such as sound quality of the micro speaker. In order to enable the speaker to have higher sensitivity to a sound signal and increase the volume of the speaker, the rated operating power of the existing speaker module becomes higher and higher, so that there is more heat generated by the speaker during operation. Particularly, when the speaker module is pushed by an intelligent power amplifier, the speaker generates more heat. However, since the speaker module has a smaller structure, and the internal structure thereof is complicated, the problem of poor heat dissipation often occurs. The high temperature generated by the speaker during operation may easily influence the components such as the vibration diaphragm and the magnetic circuit system, causing phenomena of elasticity change of the vibration diaphragm, demagnetization of the magnetic circuit system or the like, and seriously affecting the sound performance of the speaker.

It is therefore necessary to design a speaker module having a good heat dissipation structure, or design a heat-dissipating device capable of providing a good heat dissipation environment to a micro speaker and a speaker module.

SUMMARY OF THE INVENTION

The present invention is directed to provide a speaker device having sound heat dissipation capability.

An embodiment of this disclosure provides a speaker module, including: a module housing having an inner cavity, wherein the inner cavity includes a front cavity and a rear cavity spaced apart from the front cavity, and the front cavity is communicated with an external space; a speaker assembly mounted in the inner cavity, wherein the speaker assembly includes a vibration diaphragm spacing the front cavity and the rear cavity apart; and a heat-dissipating member having a heat-conducting section and a heat-dissipating section, wherein the heat-conducting section is in contact with the speaker assembly, and the heat-dissipating section stretches into the front cavity, wherein the vibration of the vibration diaphragm allows air in the front cavity to flow to increase the heat-dissipating rate of the heat-dissipating section.

Preferably, the heat-dissipating section has a heat-dissipating structure for increasing a heat-dissipating area, the heat-dissipating structure may be a heat-dissipating fin and/or a heat-dissipating pin. Particularly, the direction of the inner cavity leading to the external space is a sound-producing direction, and the heat-dissipating fin is preferably parallel to the sound-producing direction.

The speaker assembly includes a magnetic circuit system, the heat-dissipating member may be fixedly mounted in the inner cavity, and the heat-conducting section is in contact with the magnetic circuit system. Particularly, the magnetic circuit system may have a basin frame located at the bottom of the speaker assembly, the heat-dissipating member and the basin frame are of an integrated structure, and the heat-conducting section is connected to the basin frame.

Preferably, the heat-dissipating member may be integrally formed with the module housing, silicone grease may be applied between the heat-conducting section and the speaker assembly.

Additionally, the front cavity may be a lateral sound-producing front cavity, and a sound-producing hole is provided within the side wall of the module housing in a direction parallel to the vibration diaphragm. The module housing may include a first housing and a second housing, and the first housing and the second housing are combined to constitute the inner cavity.

The inventor of the present invention finds that, although there are technical solutions in which a heat-dissipating device is added in the speaker structure in the prior art, there is not a technical solution of taking air flow generated by vibration of the vibration diaphragm as a means to accelerate heat dissipation. The heat-dissipating section of the heat-dissipating member according to the present invention stretches into the front cavity, so that air flow in the front cavity can conduct heat away more efficiently; and moreover, when the front cavity is a lateral sound-producing front cavity, the heat-dissipating member is simple in structure, and thus the internal space of the speaker module can be saved. Therefore, the technical solution of the present invention is a novel technical solution.

Further features of the present invention and advantages thereof will become apparent from the following detailed description of exemplary embodiments according to the present invention with reference to the accompanying drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
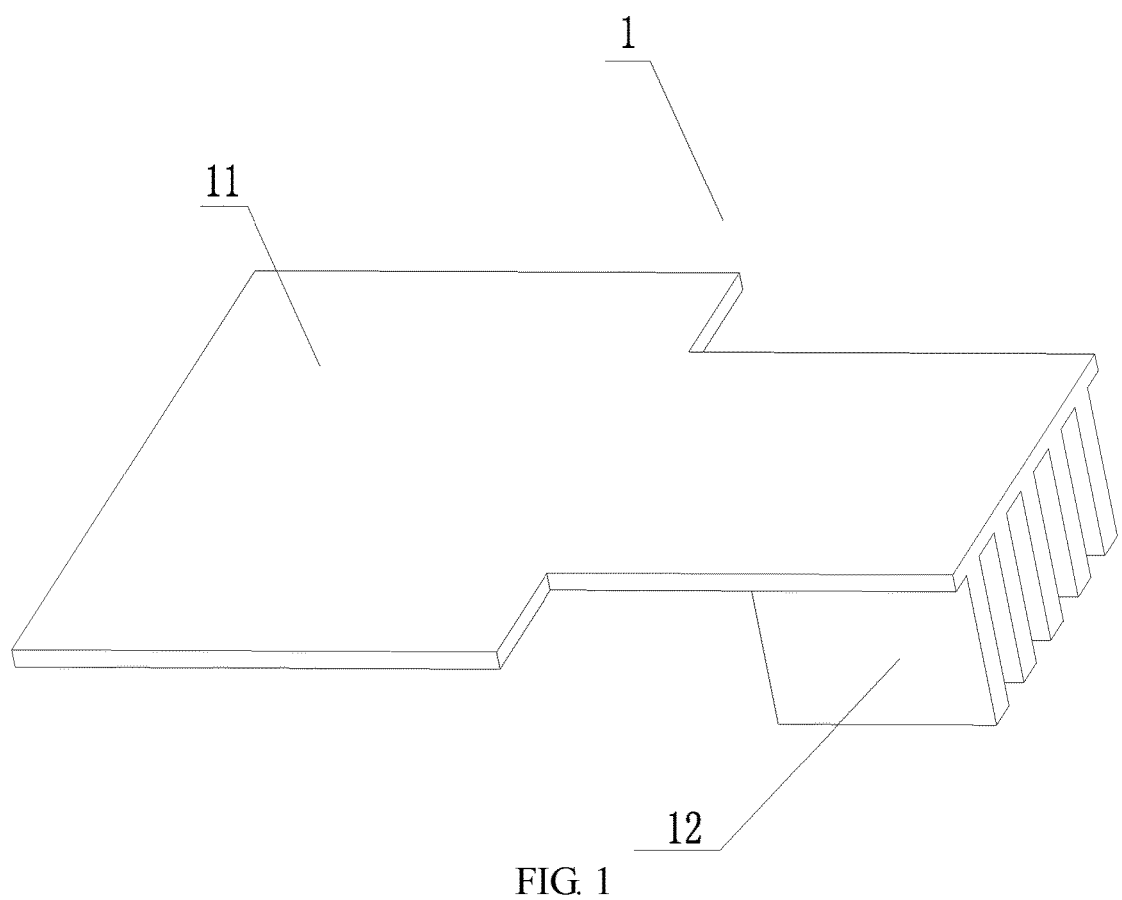
FIG. 1 is a schematic structural diagram of a heat-dissipating member according to a specific embodiment of the present invention.

Various exemplary embodiments of the present invention will now be described in detail with reference to the accompanying drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it does not need to be further discussed in the followed figures.

The present invention provides a speaker module, including a module housing, a speaker assembly and a heat-dissipating member. The module housing has an inner cavity for accommodating the speaker assembly, and the module housing also has a sound-producing hole for producing sound. Particularly, the inner cavity includes a front cavity and a rear cavity spaced apart from the front cavity, and the front cavity is communicated with an external space via the sound-producing hole. The acoustic wave generated by the speaker assembly during operation is transmitted from the front cavity to the external space via the sound-producing hole. The speaker assembly includes a vibration diaphragm and is mounted in the inner cavity; generally, edges of the vibration diaphragm are fixedly mounted in the inner cavity, and the middle portion of the vibration diaphragm can vibrate vertically in the inner cavity. The vibration diaphragm spaces the front cavity and a rear cavity apart; particularly, the vibration diaphragm has a front side and a back side; the back side of the vibration diaphragm is generally connected to a voice coil; when the vibration diaphragm vibrates, the acoustic wave is mainly transmitted from the front side of the vibration diaphragm to the front cavity, and then to the outside of the speaker module. The heat-dissipating member is fixed to the speaker module and has a heat-conducting section and a heat-dissipating section. The heat-conducting section is in contact with the speaker assembly to conduct away heat generated by the speaker during operation. Particularly, the heat-dissipating section stretches into the front cavity for conducting heat in the speaker assembly and the heat-conducting section to the front cavity. As described above, the acoustic wave generated by the speaker assembly during operation is mainly transmitted from the front cavity, vibration of the vibration diaphragm and transmission of the acoustic wave allow air in the front cavity to flow, and there is air flow between the front cavity and the external space. The heat-dissipating section located at the front cavity can increase the heat-dissipating rate under the action of air flow to dissipate heat into the external space more efficiently. Particularly, the front cavity in the present invention not only represents a part of the inner cavity for producing sound in the module housing, but also represents an internal structure for producing sound, such as a sound-producing conduit located at the front side of the vibration diaphragm.

Figure 4:
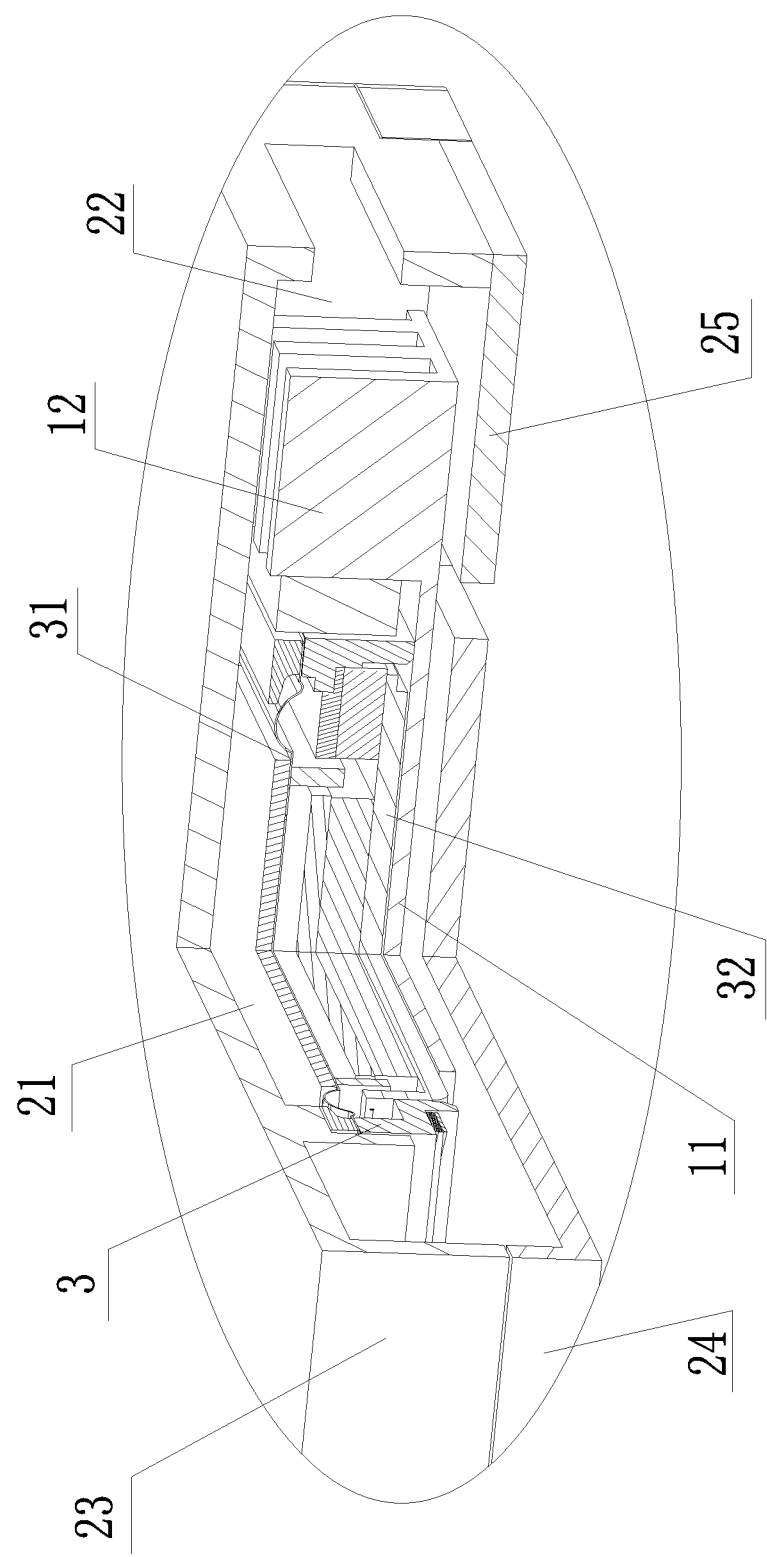
FIG. 4 is a partially enlarged cross-sectional view of a speaker module according to a specific embodiment of the present invention.

In a specific embodiment of the present invention, in order to improve the heat-dissipation capability of the speaker module, the heat-dissipating member 1 may have a larger heat-dissipating area. As shown in FIG. 1, the heat-dissipating section 12 may have a heat-dissipating structure for increasing the heat-dissipating area. In the embodiment shown in FIG. 1, the heat-dissipating structure is a heat-dissipating fin arranged on the heat-conducting section 11 and stretching towards the position of the front cavity 22. Particularly, the structure of the heat-dissipating fin cannot affect the speaker module in normal sound generation, and the sound generated by the vibration diaphragm 31 is transmitted from the front cavity 22 to the external space; and therefore, the direction leading to the external space from the front cavity 22 is a sound-producing direction of the speaker module. Preferably, as shown in FIG. 4, the heat-dissipating fin may be parallel to the sound-producing direction, so that the acoustic wave can be transmitted from the front cavity 22 smoothly. Besides, the specific feature of the heat-dissipating structure is not limited in the present invention, and persons skilled in the art can design features of the heat-dissipating structure based on the actual situation of the speaker module, such as the size of the front cavity 22 and processing difficulty of the heat-dissipating structure. The heat-dissipating structure also may be a heat-dissipating pin stretching from the heat-conducting section 11 or other structures.

The heat-dissipating section 12 of the heat-dissipating member 1 may be in contact with components with relatively stronger heat-producing capability or heat-conducting capability on the speaker assembly 3 to improve the heat-transferring capability. In embodiments of the present invention shown in FIG. 2 and FIG. 3, the speaker assembly 3 includes a magnetic circuit system, which is a component with a relatively higher heat-producing amount in the speaker; the magnetic circuit system has a relatively stronger heat-conducting capability and is generally made of metallic materials. The heat-dissipating member 1 may be fixedly mounted in the inner cavity 21, and the heat-conducting section 11 is in contact with the bottom of the magnetic circuit system. In other embodiments of the present invention, the heat-conducting section 11 also may be in contact with other positions of the magnetic circuit system.

Particularly, in another embodiment of the present invention, the magnetic circuit system may include a magnet, a washer and a basin frame 32, and the basin frame 32 is located at the bottom of the magnetic circuit system for carrying the magnet and the washer. The basin frame 32 is made of a magnetically permeable material, typically an iron-based material. Therefore, the heat-dissipating member 1 may be integrally formed with the basin frame 32 by casting or stamping, to constitute an integrated structure, and the heat-conducting section 11 is connected to the bottom of the basin frame 32.

Except for the forming method of the heat-dissipating member 1 described in the above embodiments, the heat-dissipating member 1 of the present invention also may have assembling connection and forming relationship with other components of the speaker module. For example, in another embodiment, the heat-dissipating member 1 also may be integrally formed with the module housing by injection molding. The module housing is typically made of plastic materials; during processing of the module housing by injection molding, the heat-dissipating member 1 may be fixed in an injection mold; after the injection molding of the module housing is completed, the heat-dissipating member 1 is then fixed in the module housing. Such a forming manner can simplify the assembling steps of the speaker module.

Figure 2:
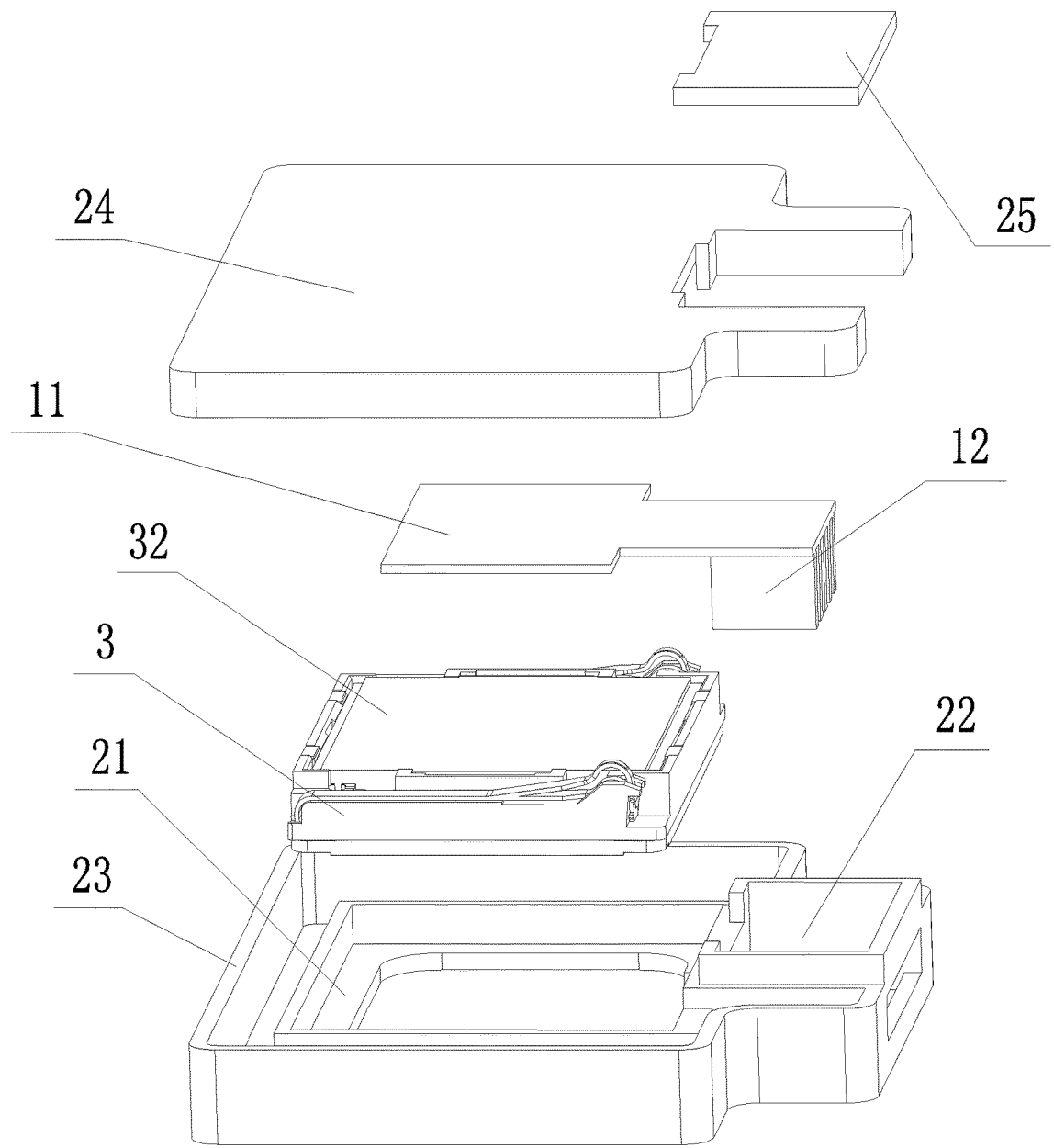
FIG. 2 is an exploded view of parts of a speaker module according to a specific embodiment of the present invention.
Figure 3:
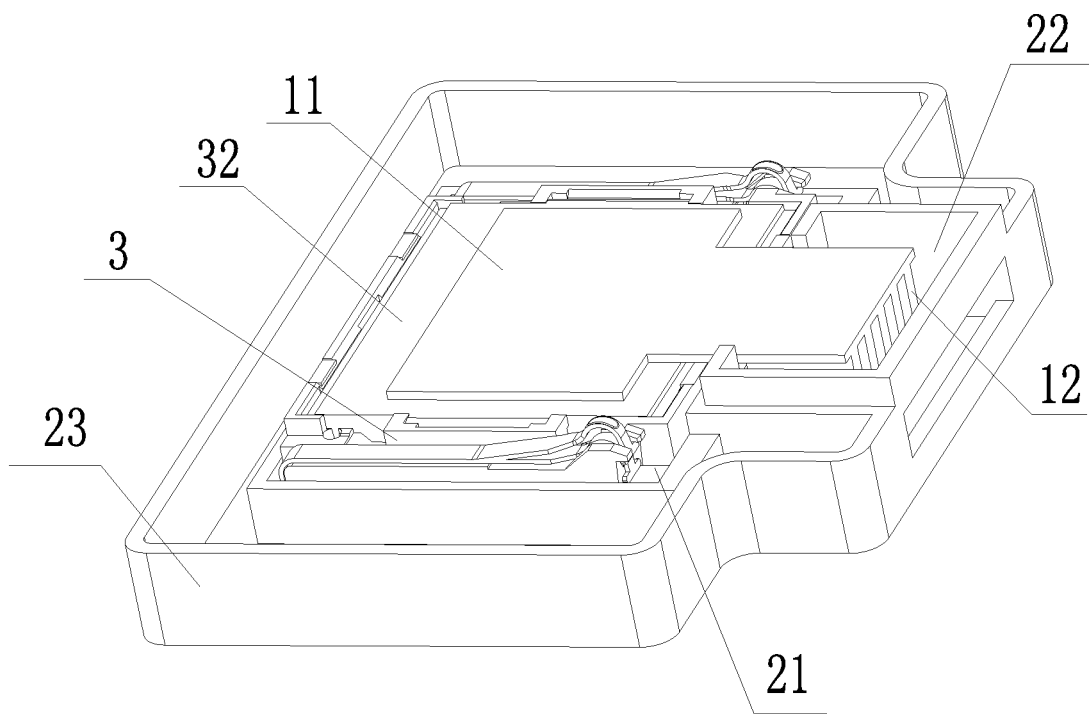
FIG. 3 is a schematic structural diagram of a speaker module after removing a second housing and a front cavity cover according to a specific embodiment of the present invention.

Additionally, the front cavity 22 and the sound-producing hole are typically located above the front side of the vibration diaphragm 31, and the acoustic wave generated by the vibration diaphragm 31 may be directly transmitted to the external space in the normal direction of the vibration diaphragm 31. However, in order to reduce the thickness of the speaker module, the front cavity 22 may be a lateral sound-producing front cavity 22. As shown in FIG. 2 to FIG. 4, the lateral sound-producing front cavity 22 is located on the side of the speaker assembly 3; a sound-producing hole may be formed in the side wall of the module housing in a direction parallel to the vibration diaphragm 31. The acoustic wave generated by the vibration diaphragm 31 propagates in a direction parallel to the vibration diaphragm 31, and is transmitted out from the lateral sound-producing front cavity 22 via the lateral sound-producing hole. In an embodiment where the front cavity 22 is a sound-producing front cavity, as shown in FIG. 4, the heat-conducting section 11 of the heat-dissipating member 1 may extend laterally directly from the bottom of the speaker assembly 3, and the heat-dissipating section 12 stretches from the heat-conducting section 11 to enter the front cavity 22 located on the side of the speaker assembly 3.

Preferably, coating materials for enhancing the heat-conducting performance, such as silicone grease, may be applied between the heat-conducting section 11 and the speaker assembly 3. The material adopted by the heat-dissipating member 1 should have a higher heat-conducting coefficient, and may be typically made of metallic materials, such as aluminum or stainless steel.

Additionally, in embodiments of the present invention, as shown in FIG. 2, the module housing may include a first housing 23 and a second housing 24. The second housing 24 and the first housing 23 are combined to constitute the inner cavity by snapping together, as shown in FIG. 4. The module housing also may include a front cavity cover 25 mounted on the front cavity 22 to enclose the heat-dissipating section 12 in the front cavity 22.

Although the present invention has been described in detail through some specific embodiments, it should be understood by persons skilled in the art that the above examples are only intended to be illustrative but not to limit the scope of the present invention. It also should be understood by persons skilled in the art that modifications may be made to the above embodiments without departing from the scope or the spirit of the present invention. The present invention is limited by the appended claims.

What is claimed is:

1. A speaker module, comprising:
   a module housing having an inner cavity, wherein the inner cavity comprises a front cavity and a rear cavity spaced apart from the front cavity, and the front cavity is communicated with an external space;
   a speaker assembly mounted in the inner cavity, wherein the speaker assembly comprises a vibration diaphragm spacing the front cavity and the rear cavity apart; and
   a heat-dissipating member having a heat-conducting section and a heat-dissipating section, wherein the heat-conducting section is in contact with the speaker assembly, and the heat-dissipating section stretches into the front cavity, wherein
   the vibration of the vibration diaphragm allows air in the front cavity to flow to increase the heat-dissipating rate of the heat-dissipating section,
   the speaker assembly comprises a magnetic circuit system having a basin frame located at the bottom of the speaker assembly, the heat-dissipating member and the basin frame are of an integrated structure, and the heat-conducting section is connected to the basin frame,
   the heat-dissipating section has a heat-dissipating fin and/or a heat-dissipating pin for increasing a heat-dissipating area, and
   the direction of the inner cavity leading to the external space is a sound-producing direction, and the heat-dissipating fin is extended in parallel with the sound-producing direction.

2. The speaker module according to claim 1, wherein the speaker assembly comprises a magnetic circuit system, the heat-dissipating member is fixedly mounted in the inner cavity, and the heat-conducting section is in contact with the magnetic circuit system.

3. The speaker module according to claim 1, wherein the heat-dissipating member is integrally formed with the module housing.

4. The speaker module according to claim 1, wherein the front cavity is a lateral sound-producing front cavity, and a sound-producing hole is provided within the side wall of the module housing in a direction parallel to the vibration diaphragm.

5. The speaker module according to claim 1, wherein silicone grease is applied between the heat-conducting section and the speaker assembly.

6. The speaker module according to claim 1, wherein the module housing comprises a first housing and a second housing, and the first housing and the second housing are combined to constitute the inner cavity.

* * * * *